US005971774A

United States Patent [19]

Kuki et al.

[11] Patent Number: 5,971,774

[45] **Date of Patent: *Oct. 26, 1999**

[54] CONNECTOR FOR A CIRCUIT BOARD

[75] Inventors: Heiji Kuki; Kazuhiko Nimura, both of Yokkaichi, Japan

[73] Assignee: Sumitomo Wiring Systems, Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/855,467

[22] Filed: May 13, 1997

[30] Foreign Application Priority Data

May 27, 1996 [JP] Japan .................................... 8-132060

[51] Int. Cl.[6] ........................................................ H01R 9/09

[52] U.S. Cl. ............................................... 439/79; 439/892

[58] Field of Search ................................. 439/70, 71, 72, 439/73, 79, 80, 892.1

[56] References Cited

U.S. PATENT DOCUMENTS 4,533,188 8/1985 Miniet .................................. 439/892.1
4,776,804 10/1988 Johnson et al. ....................... 439/892.1
4,968,263 11/1990 Silbernagel et al. .................... 439/246
4,992,054 2/1991 Cassan ................................. 439/892.1
5,076,796 12/1991 Kusayanagi et al. ...................... 439/83
5,078,626 1/1992 Matsuoka et al. ................... 439/892.1
5,387,137 2/1995 Bouwknegt et al. ................... 439/736

FOREIGN PATENT DOCUMENTS 62-136784 6/1987 Japan .
4-119973 10/1992 Japan .

OTHER PUBLICATIONS

Abstract of Japanese Pub. No. 04–179078, Jun. 25, 1992, entitled: Connector for Printed Circuit Board.

*Primary Examiner*—Hien Vu
*Attorney, Agent, or Firm*—Banner & Witcoff, Ltd.

[57] ABSTRACT

To prevent increase in stress on a soldered join between a terminal pin and a circuit board in the event of thermal expansion, a support (22) with a larger diameter and a recess (21) with a smaller diameter are formed on a terminal pin (20). An alignment plate (30) is arranged to be movable with respect to a connector housing (11) between a support position in which the support member (22) is a close fit in a position fixing hole (31), and a release position in which the recess (21) is a loose fit. This eliminates the increase in stress on the soldered portion (M) due to differing rates of thermal expansion and contraction of the circuit board (P) and alignment plate (30).

11 Claims, 8 Drawing Sheets

CONNECTOR FOR A CIRCUIT BOARD

This application is a continuing application of co-pending U.S. patent application Ser. No. 08/855,467 filed May 13, 1997.

The present invention relates to a base plate connector for attachment to an electrical circuit board or base plate.

BACKGROUND AND SUMMARY TO THE INVENTION

As shown in FIG. 17 of this specification, a base plate connector has a plurality of long and thin terminal pins 3 which protrude from the rear face of a connector housing 2 and bend downwards. The anterior ends of the terminal pins 3 are aligned so as to fit with connecting holes H formed in a circuit base plate P. It is arranged so that, when attachment is carried out, the connector housing 2 is fixed at a specified position on the circuit base plate P, the anterior end of the terminal pins 3 being inserted 15 into the connecting holes H and being fixed by means of soldering M. The terminal pins are easily bent out of position, and so the connector housing 2 has an alignment plate 4 fixed thereon, this alignment plate 4 serving as a means for carrying out with certainty the insertion operation of the terminal pins 3 into the connecting holes H. The alignment plate 4 has position fixing holes 5 that correspond to the connecting holes H of the circuit base plate P. The anterior ends of the terminal pins 3 pass through the position fixing holes 5 and as a consequence the mutual positioning among the terminal pins 3 comes to correspond to the alignment of the connecting holes H.

In the state where the base plate connector 1 is attached to the circuit base plate P, if the connector housing 2, the alignment plate 4, and the circuit base plate P are subjected to a temperature change, due to the differing rates of thermal expansion of the different materials used, there is a possibility of a force applying so as to cause a relative shift in position between the position fixing holes 5 and the connecting holes H along a direction that is transverse to the terminal pins 3. However, in the case of the conventional alignment plate 4, since it is necessary to fix the position of the terminal pins 3 with a high degree of accuracy, the position fixing holes 5 are arranged to be of the minimum necessary size in order to prevent sideways movement of the terminal pins 3, as shown in FIG. 18. For this reason, if a transverse force applies so that the position fixing holes 5 shift in position with respect to the connecting holes H, this force is transmitted to the soldered portions M via the terminal pins 3, and stress on the soldered portions M increases. This may weaken or break the electrical connection.

The present invention has been developed after taking the above problem into account, and aims to prevent an increase in stress on the soldered portions joining the terminal pins to the circuit base plate as the ambient temperature changes.

According to the invention, there is provided a connector for attachment to a printed circuit board which comprises a connector housing having a plurality of elongate electrical terminals projecting therefrom in a first direction and an alignment member attached to said housing. The housing is adapted to retain the free ends of said terminals in a substantially fixed orientation with respect to the housing. The alignment member is movable with respect to the housing in the first direction from a temporary position to a final position. The terminals are tightly retained by said alignment member in the temporary position and loosely retained by said alignment member in the final position.

Such an alignment member has the advantage that the terminals are tightly retained for positioning with respect to the circuit board or other electrical component, yet are free to move relative to the alignment member once in the final position.

Preferably the alignment member is substantially planar and has a plurality of apertures to receive the tips of the terminals in sliding relationship. The apertures are preferably enlarged on the side of the circuit board or component to accommodate solder; this ensures that the eventual soldered connection of the terminals is strong and electrically sound.

In a preferred embodiment the terminals are waisted immediately behind the tip so as to be a loose fit in the alignment member when it has been moved to the final position. Alternatively, the terminal can be flanged outwardly behind the tip, and the flanged portion arranged to be a tight sliding fit in a respective aperture. In the final position the flange is moved out of the aperture to leave the terminal in said aperture with clearance.

The alignment member is preferably retained on the housing by detent means whereby it can be snapped from the temporary to the final positions. In the case where the components are of plastic or resin material the alignment member may have opposite projections for engagement in opposite parallel recesses of the housing. These recesses may comprise opposite parallel grooves to retain opposite edges of the alignment member, two grooves being provided on each side to define the temporary and final positions.

Preferably the alignment member is arranged between the housing and the circuit board or other electrical component. This arrangement ensures that simple pressure on the housing can automatically snap the alignment member to the final position where it remains sandwiched in place. This has the further advantage that the alignment member cannot move relative to the housing and thus place stress on the soldered connection of the terminals.

BRIEF DESCRIPTION OF DRAWINGS

Other features of the invention will be apparent from the following description of several preferred embodiments shown by way of example only in the accompanying drawings in which.

DESCRIPTION OF PREFERRED EMBODIMENTS

Figure 1:
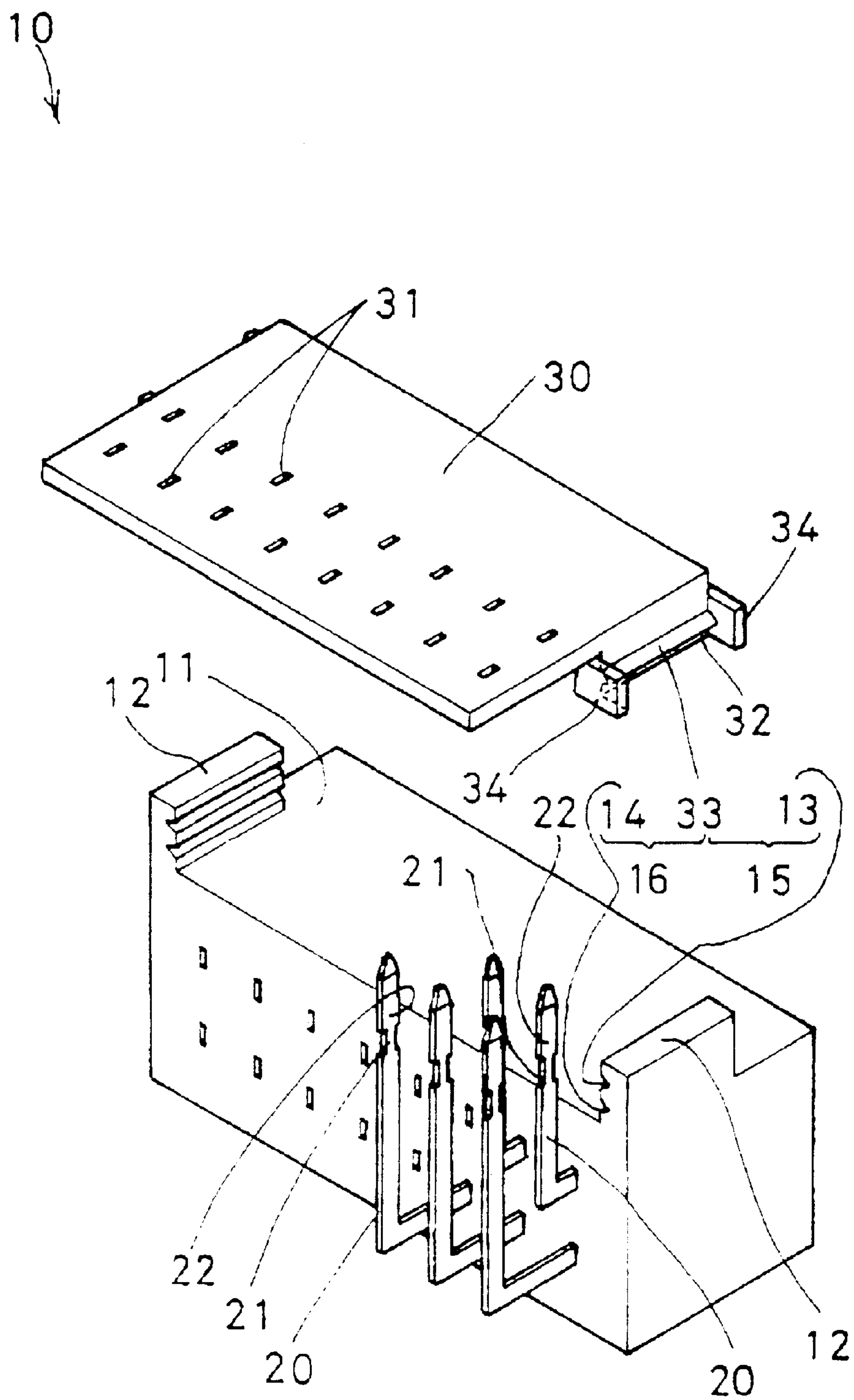
FIG. 1 is an inverted diagonal view of embodiment 1 of the present invention showing a separated state of a connector housing and an alignment plate.

Embodiment 1 of the present invention is explained hereinbelow, with reference to FIGS. 1 to 7.

A base plate connector 10 comprises a connector housing 11, a plurality of terminal pins 20 and an alignment plate 30.

A base face of the connector housing 11 that faces a circuit base plate P has a pair of foot members 12 formed thereon so as to protrude from the left and right sides. In the state where the foot members 12 make contact with the surface of the circuit base plate P, this connector housing 11 is fixed in a specified position on the surface of the circuit base plate P by means of a position fixing means such as the mutual fitting of a pin and a hole (not shown). Furthermore, the foot members 12 are fixed to the circuit base plate P by means of machine screws (not shown) that are screwed in to the base face of the foot members 12, the machine screws passing through the circuit base plate P.

The mutually facing inner side faces of the foot members 12 have alignment stopping grooves 13 and release stopping grooves 14 which are triangular when seen cross-sectionally. These grooves 13,14 are mutually parallel and extend in the anterior-posterior direction, from edge to edge. The alignment stopping groove 13 is located below the release stopping groove 14. Protrusions 33 of the alignment plate 30, to be described later, can be fitted into and removed from the alignment stopping grooves 13 and the release stopping grooves 14. A temporary supporting means 15 consists of the alignment stopping grooves 13 and protrusions 33 of the alignment plate 30, and a supporting means 16 consists of the release stopping grooves 14 and the protrusions 33.

A plurality of terminal pins 20 are provided on the connector housing 11. Each terminal pin 20 protrudes from the rear face of the connector housing 11 and is bent in a downward direction. The anterior end of each terminal forms a right angle with respect to the base face of the connector housing 11, and is of such a length as to extend downwards beyond the base face. The anterior ends of these terminal pins 20 are inserted simultaneously into connecting holes H of the circuit base plate P. Accordingly, the anterior ends of the terminal pins 20 should be mutually parallel, and all the end portions of the terminal pins 20 aligned so as to correspond to the alignment of the connecting holes H.

Figure 6:
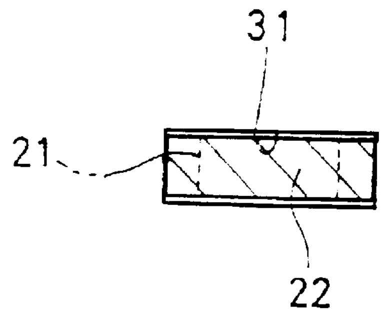
FIG. 6 is a cross-sectional view of embodiment 1 showing the relationship between the position fixing holes and the supported members of the terminal pins when the alignment plate is in the alignment position.

The cross-sectional shape of the anterior ends of the terminal pins 20 is rectangular, as shown in FIG. 6. Further, movement permitting recesses 21 are formed (see FIG. 2) on the anterior ends of the terminal pins 20 by cutting, and narrowing the width. The length of these recesses 21 is slightly greater than the thickness of the alignment plate 30. A portion of the terminal that is located at the anterior end forms a support 22. The boundary between the recess 21 and the support 22 is located approximately at the same height as the base face of the foot member 12. When the supports 22 are fitted into the position fixing holes 31 of the alignment plate 30, to be described later, the terminal pins 20 are held in a proper position for aligning with holes H in plate P. When the recesses 21 are fitted loosely into the position fixing holes 31, movement of the terminal pins 20 with respect to the alignment plate 30 is possible.

The alignment plate 30 is attached to the connector housing 11, to ensure the alignment of the anterior ends of the terminal pins 20, with a high degree of accuracy, with the connecting holes H.

The alignment plate 30 has a plurality of position fixing holes 31 that correspond to the same arrangement as the connecting holes H is the circuit base plate P. The position fixing holes 31 vertically extend through the alignment plate 30 and have a rectangular shape. As shown in FIG. 6, the dimensions in the anterior-posterior direction and the left-right direction are such as to allow the supports 22 of terminal 20 to fit tightly therein. The position fixing holes 31 correspond with a high degree of accuracy to the alignment of the connecting holes H. When the supports 22 are fitted into the position fixing holes 31, the anterior ends of all the terminal pins 20 are aligned with the connecting holes H.

Figure 7:
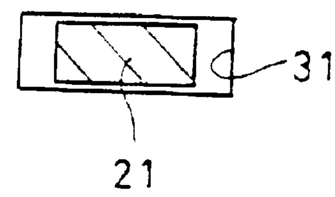
FIG. 7 is a cross-sectional view of embodiment 1 showing the relationship between the position fixing holes and the terminal pins when the alignment plate is in the release position.

In the state where the recesses 21 are fitted in the position fixing holes 31, as shown in FIG. 7, a space is provided between the anterior-posterior edges of the position fixing holes 31. The dimension of this anterior-posterior space is set after taking into consideration the difference in the rate of thermal expansion of the circuit base plate P and the alignment plate 30, so that the terminal does not make contact with the edge of the position fixing hole 31 when such relative movement occurs. There is almost no space between the edges of the position fixing holes 31 and the terminal along the left-right edges (the upper and lower edges in FIGS. 6 and 7). This arrangement is a consequence of having taken into account the direction of the fibres and the direction of flow of the mould during the moulding process of the circuit base plate P and the connector housing 11, and has no significance beyond the fact that it is a consequence of the materials of the present embodiment.

By providing a space, even if terminal pins 20 move in an anterior-posterior direction along the circuit base plate P due to a difference, described further on, in the amount of thermal expansion between the circuit base plate P and the alignment plate 30, there is no possibility of the terminal pins 20 being distorted by contact with the edges of the position fixing holes 31.

A pair of wall members 32 are formed along both the side edges of the alignment plate 30, the wall members 32 protruding outwards. These wall members 32 are adapted to be engaged between the foot members 12 of the connector housing 11, the outer side faces of the wall members 32 and the inner side faces of the foot members 12 making contact with each other. Due to the fitting of the wall members 32 and the foot members 12, movement in the left-right direction is prevented and the position in the left20 direction of the alignment plate 30 with respect to the connector housing 11 is relatively fixed.

The outer side faces of the wall members 32 have protrusions 33 formed so as to extend in an anterior-posterior direction, the protrusions 33 being triangular when seen in cross-section, these protrusions 33 being engageable in the alignment stopping grooves 13 and the release stopping grooves 14. The wall members 32 are capable of bending inwards elastically, and when the force of the alignment plate 30 is applied in an up-down direction, the protrusions 33 move between the alignment stopping grooves 13 and the release stopping grooves 14.

When the protrusions 33 are in the alignment grooves 13, the alignment plate 30 protrudes below and beyond the base face of the foot members 12 and is temporarily supported in an alignment position whereby the support 22 of the terminal pins 20 are fitted into the position fixing holes 31. When the protrusions 33 are in the release grooves 14, the lower face of the alignment plate 30 comes to correspond with the base face of the foot members 12 and the alignment plate 30 is supported so that the position fixing holes 31 correspond to the recesses 21.

The anterior and posterior edges of the wall members 32 have a pair of anterior and posterior stoppers 34 that extend outwards. These stoppers 34 make contact with the anterior and posterior end faces of the foot members 12. This restricts the anterior-posterior movement of the wall members 32 with respect to the foot members 12.

Next, the operation of the present embodiment is explained. Before attachment to the circuit base plate P is carried out, the alignment plate 30 is connected to the connector housing 11. In order to carry out the attachment, first the anterior ends of the terminal pins 20 are passed through the respective position fixing holes 31. At this juncture, if the hole edge on the upper face side of the position fixing hole 31 has a taper shaped guiding face (not shown) formed thereon, even if a misaligned terminal pin 20 exists, such a terminal pin 20 is realigned towards the centre due to the alignment face and fits smoothly into the position fixing hole 31.

Once all the terminal pins 20 have been inserted into the position fixing holes 31, the wall members 32 are fitted between the foot members 12 and the protrusions 33 are engaged in the alignment stopping grooves 13 to place the alignment plate 30 in a temporarily supported position. The supports 22 fit tightly in the position fixing holes 31. Accordingly, the terminal pins 20 comes to correspond with a high degree of accuracy with the alignment of the connecting holes H.

Next, the base plate connector 10 is attached to the circuit base plate P. In order to carry out the attachment, first the anterior ends of the terminal pins 20, aligned according to the alignment plate 30, are inserted into the connecting holes H of the circuit base plate P. Since all the terminal pins 20 are aligned so as to correspond to the alignment of the connecting holes H, all the terminal pins 20 enter the connecting holes H smoothly and simultaneously.

Figure 2:
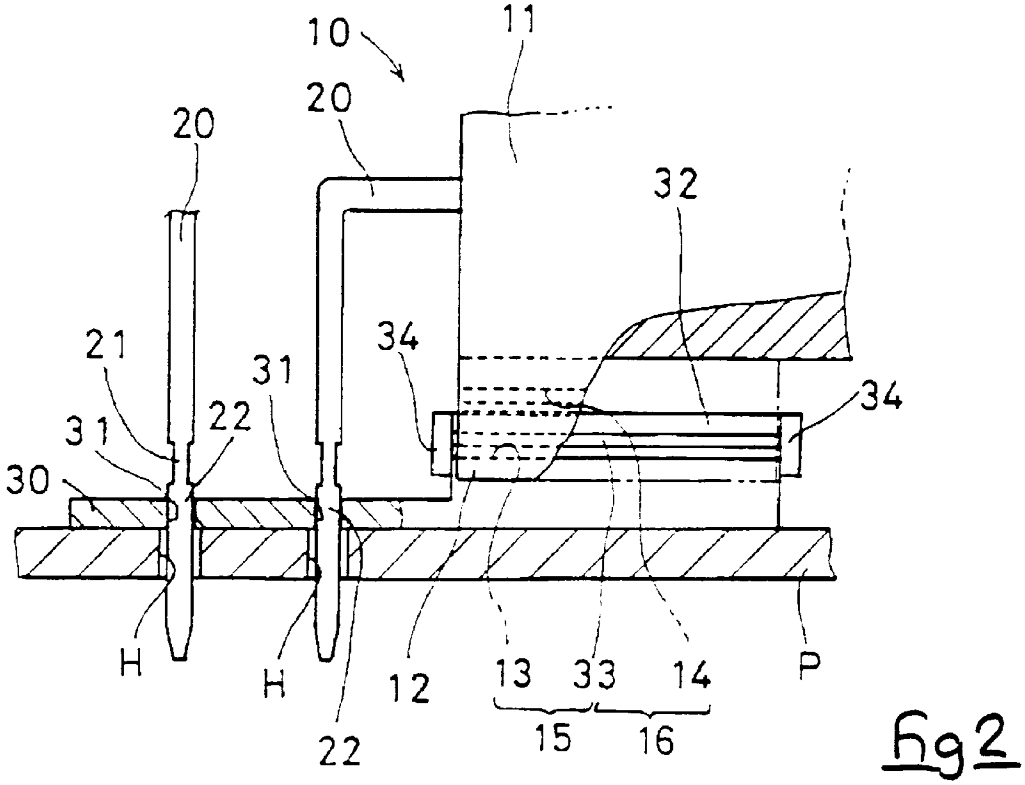
FIG. 2 is a cross-sectional view of embodiment 1 showing the inserted state of the terminal pins in the circuit base plate, the terminal pins having been aligned by means of the alignment plate.
Figure 4:
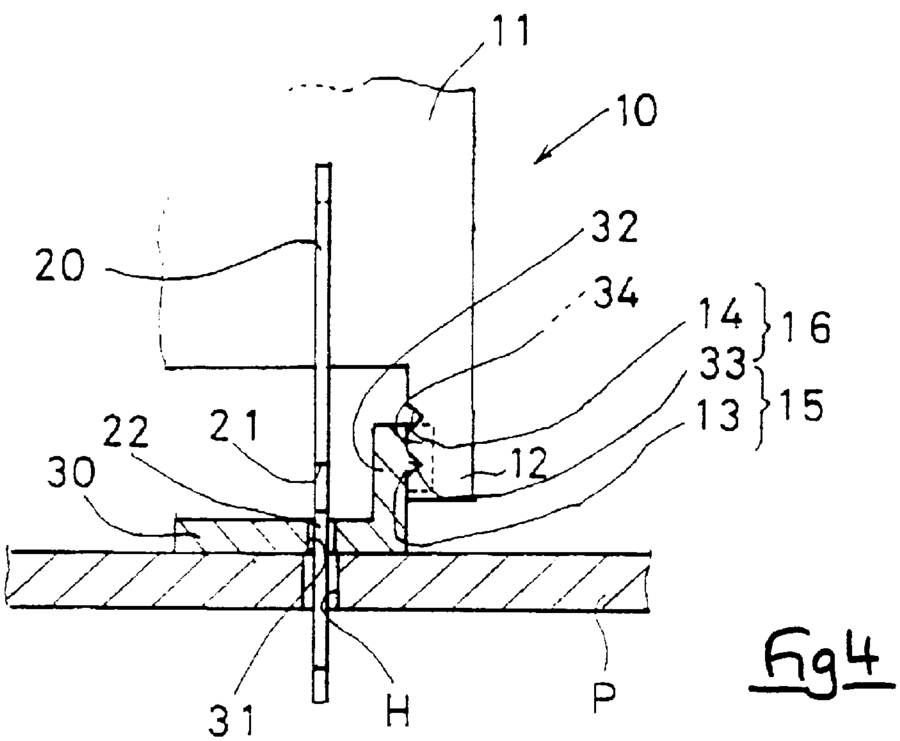
FIG. 4 is a cross-sectional view of embodiment 1 showing a state whereby the alignment plate is temporarily supported in the alignment position.

When the terminal pins 20 are inserted, as shown in FIGS. 2 and 4, the alignment plate 30 makes contact with the upper face of the circuit base plate P, and the foot members 12 of the connector housing 11 float above the circuit base plate P. From this state, when the connector housing 11 is pushed towards the circuit base plate P, the wall members 32 bend elastically and the protrusions 33 separate from the alignment grooves 13. Then, the connector housing 11 and the terminal pins 20 move downwards, the supports 22 separating from the position fixing holes 31 and the recesses 21 entering the position fixing holes 31 from above.

Figure 3:
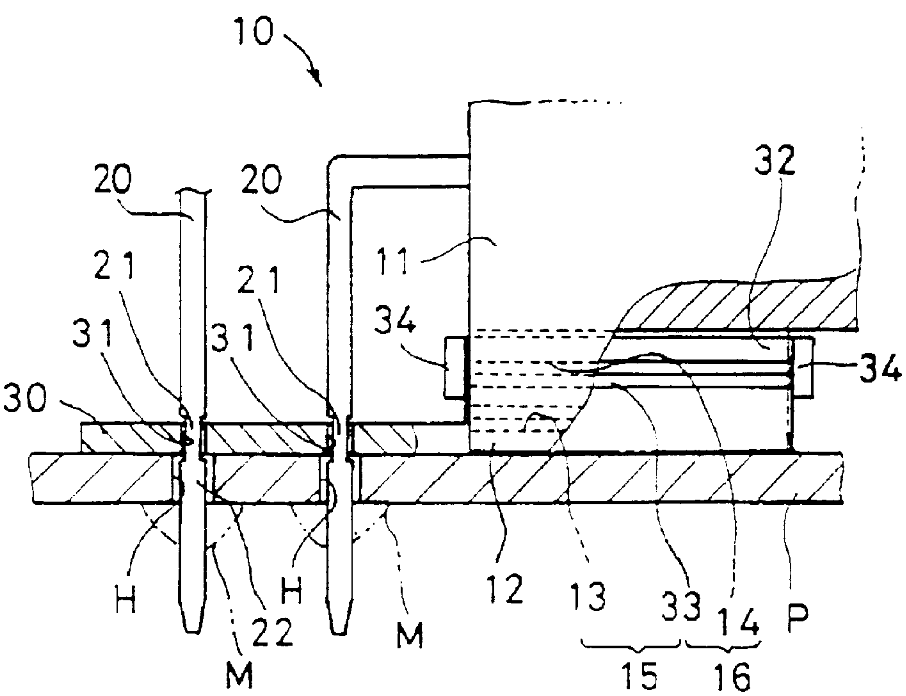
FIG. 3 is a cross-sectional view of embodiment 1 showing a state whereby the alignment plate has moved to the release position after the terminal pins have been inserted.
Figure 5:
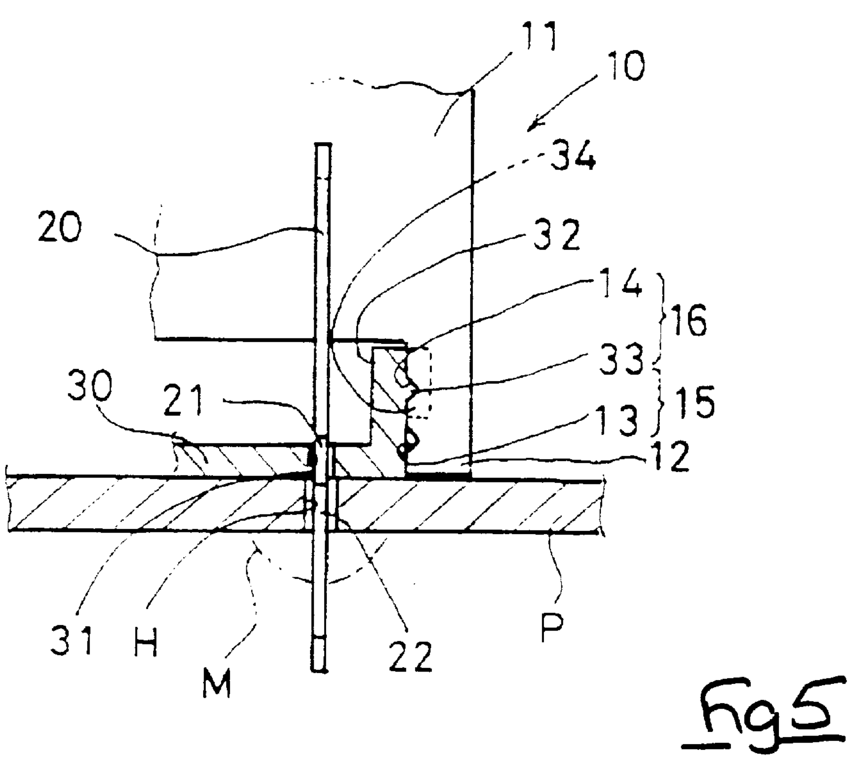
FIG. 5 is a cross-sectional view of embodiment 1 showing a state whereby the alignment plate is supported in a release position.

When the foot members 12 of the connector housing 11 make contact with the circuit base plate P, as shown in FIGS. 3 and 5, the protrusions 33 engage the release grooves 14 and the alignment plate 30 is supported in the release position. At the same time, due to the recesses 21, the terminal pins 20 become capable of moving freely relative to each other in an anterior-posterior direction along the circuit base plate P.

After that, the connector housing 11 is fixed to the circuit base plate P by means of machine screws, not shown, the portions of the terminal pins 20 that are fitted in the connecting holes H being fixed by means of solder M. In this manner, the attachment operation of the base plate connector 10 of the present embodiment to the circuit base plate P is completed.

In the attached state there is a space in the anterior-posterior direction between the position fixing holes 31 and the terminal pins 20 of the base plate P. When the alignment plate 30 expands thermally, the position fixing holes 31 can move in an anterior-posterior direction with respect to the terminal pins 20. Accordingly, there is no possibility of the terminal pins 20 being pushed in the anterior-posterior direction by the hole edges of the position fixing holes 31. As a result, an increase in stress on the soldered portion M is prevented.

Moreover, in the attached state, the movement of the alignment plate 30 with respect to the connector housing 11 in either the anterior-posterior direction or the left-right direction is prevented due to the fitting of the wall members 32 with the foot members 12 and the fitting of the foot members 12 with the stoppers 34. As a result, there is no possibility of the hole edges of the position fixing holes 31 pressing in a sideways direction against the terminal pins 20 due to movement of the alignment plate 30, and increase in stress on the soldered portion M due to movement of the alignment plate 30 is prevented.

In addition, the alignment plate 30 is supported in the release position due to the fitting of the protrusions 33 with the release grooves 14, and the alignment plate 30 makes contact with the upper face of the circuit base plate P. Accordingly, there is no possibility at all of the alignment plate 30 moving back to the alignment position.

Further, in the present embodiment, after the insertion of the terminal pins 20, along with the attachment operation of the connector housing 11 with the circuit base plate P, the alignment plate 30 is forced to move towards the release position from the alignment position. Consequently, not only is superior operability achieved compared to the case where the attachment operation of the connector housing 11 and the movement operation of the alignment plate 30 are carried out as separate processes, but also the movement of the alignment plate 30 in the release direction is carried out with certainty.

Next, embodiments 2 to 9 of the present invention are described below. However, in these embodiments only those components which differ from embodiment 1 are described, the same reference numeral being accorded to parts that have the same configuration.

Figure 8:
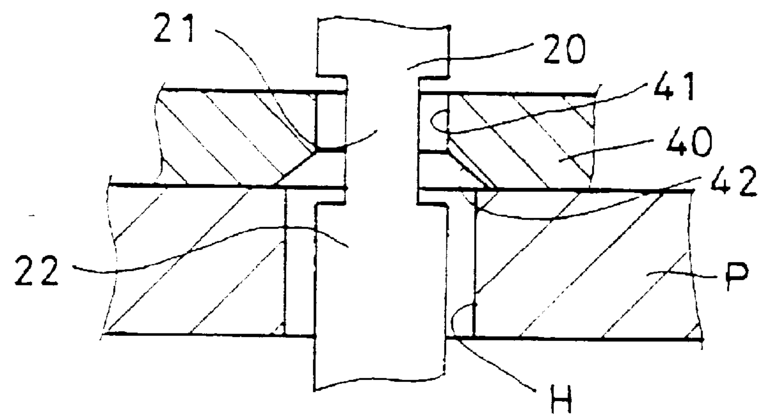
FIG. 8 is a cross-sectional view of embodiment 2.

Embodiment 2 is described hereinbelow, with reference to FIGS. 8. An alignment plate 40 has concave recesses 42 formed by cutting away the entire peripheral edges of position fixing holes 41. These recesses 42 are tapered so as to extend outwards in the downward direction. By forming this additional space, when terminal pins 20 are soldered, the solder (not shown) that passes through the connecting holes H from the lower face of the circuit base plate P collects in a sufficient quantity to give a superior connection.

Figure 9:
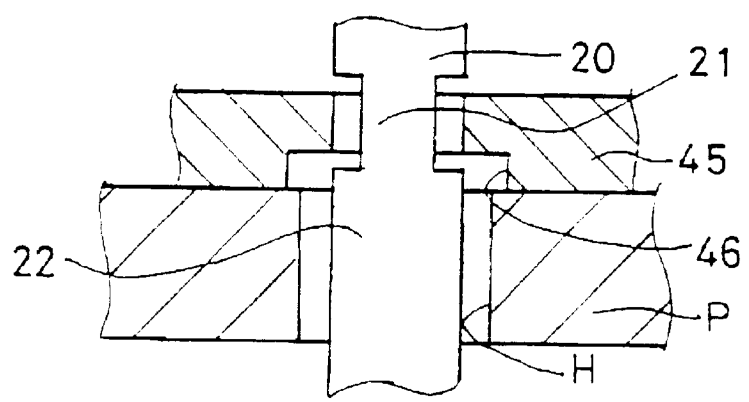
FIG. 9 is a cross-sectional view of embodiment 3.

Embodiment 3 of the present invention is described next, with reference to FIG. 9.

As in embodiment 2, an alignment plate 45 of the present embodiment also has cut away concave recesses 46 formed thereon in order to create an extra space. However, the recesses 46 are not tapered but have perpendicular sides when seen cross-sectionally. As in embodiment 2, superior soldering is achieved.

Figure 10:
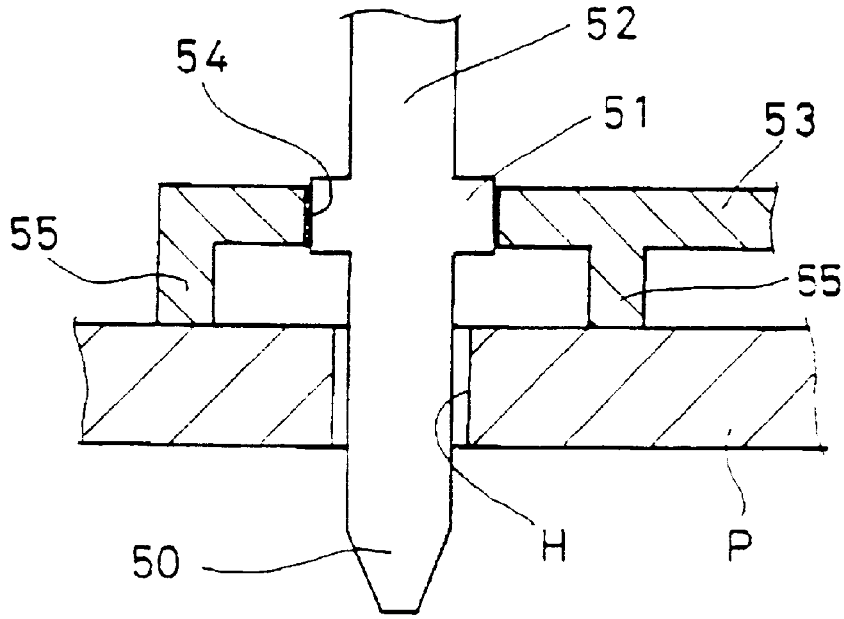
FIG. 10 is a cross-sectional view of embodiment 4 showing a state whereby terminal pins are inserted into a circuit base plate, the terminal pins having been aligned by means of an alignment plate temporarily supported in the alignment position.
Figure 11:
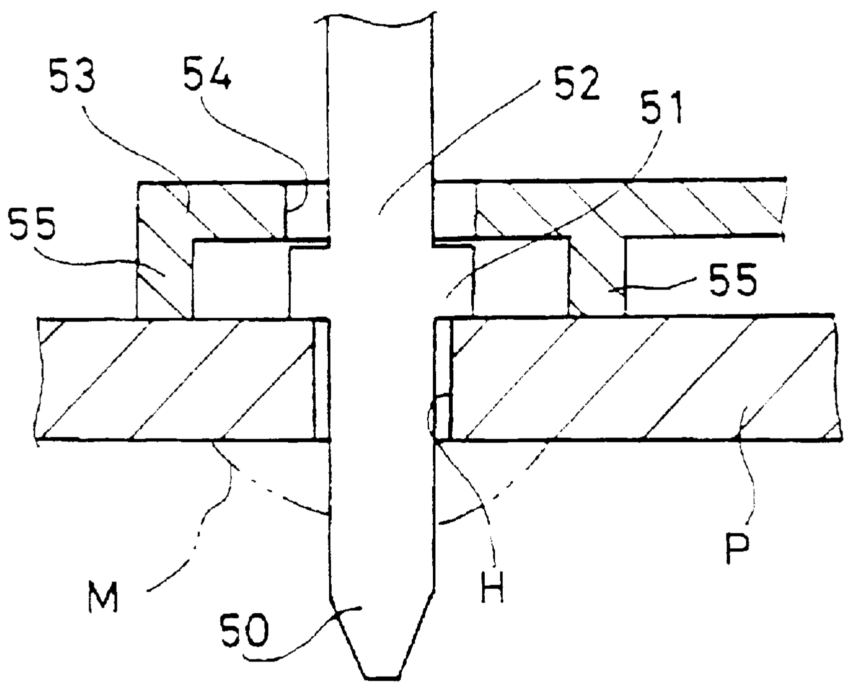
FIG. 11 is a cross-sectional view of embodiment 4 showing a state whereby the alignment plate moves to a release position after the terminal pins have been inserted.

Embodiment 4 of the present invention is described next, with reference to FIG. 10 and FIG. 11.

A support member 51 of a terminal pin 50 is formed by making specified locations protrude on the left and right sides as shown in the diagram. The dimensions of the support members 51 of the present embodiment are arranged to be greater than the basic dimensions of the terminal pins 50. Furthermore, the portion located above the support member 51 is a movement permitting region 52. The lower face of an alignment plate 53 has protrusions 55 on either side of position fixing holes 54. Due to these protrusions 55 the alignment plate 53 is attached to a circuit base plate P while maintaining a space between it and the upper face of the circuit base plate P. In the attached state, support members 51, which separate from the position fixing holes 54, come to be located within the space between the alignment plate 53 and the circuit base plate P, so permitting relative lateral movement (FIG. 11).

Figure 12:
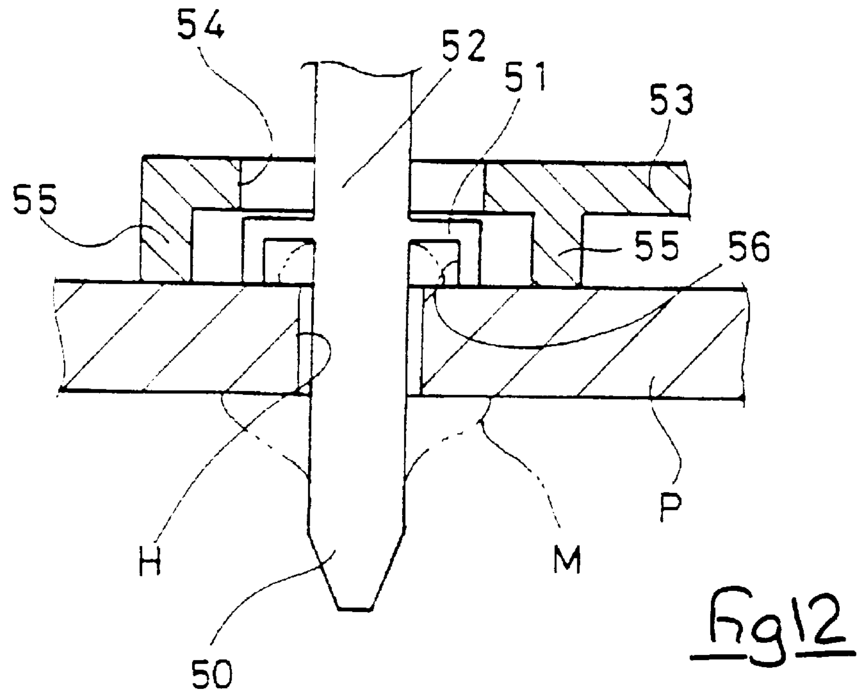
FIG. 12 is a cross-sectional view of embodiment 5.

Embodiment 5 of the present invention is described next, with reference to FIG. 12, and is a variation of embodiment 4. Cut away portions 56 are formed in support members 51 of terminal pins 50. By forming these cut away portions 56, the support members 51 are raised up from the circuit base plate P. This arrangement gives a recess for solder and results in a superior connection.

Figure 13:
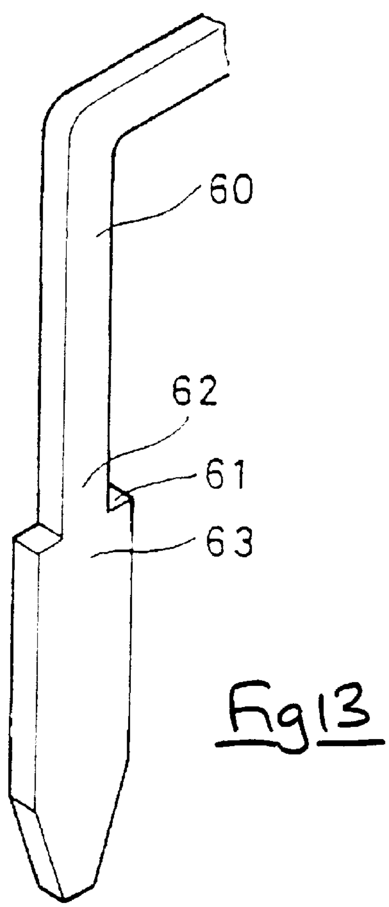
FIG. 13 is a partially enlarged diagonal view of a terminal pin of embodiment 6.

Embodiment 6 of the present invention is described next, with reference to FIG. 13.

A terminal pin 60 has a shape whereby the width of the anterior end portion is widened in a stepped manner. A stepped portion 61 serves as a boundary between a movement permitting recess 62 located above and a support 63 located below.

Figure 14:
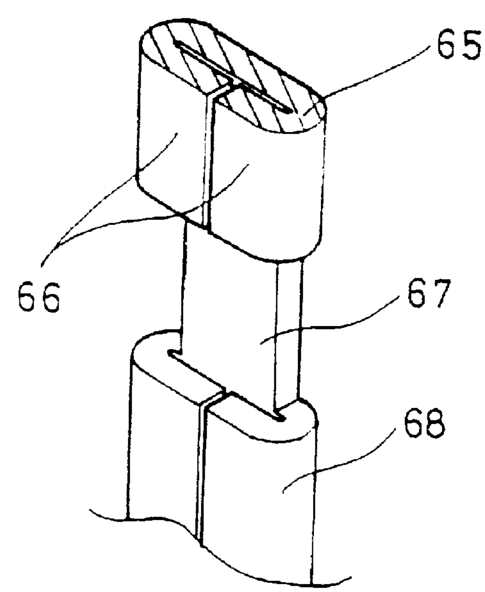
FIG. 14 is a partially enlarged diagonal view of a terminal pin of embodiment 7.

Embodiment 7 of the present invention is described next, with reference to FIG. 14.

A terminal pin 65 is formed into a double layer by folding both side edges inwards. In a specified location, a folded over portion 66 is partially cut away, giving a simple plate shape. This plate shaped portion constitutes a movement permitting recess 67, a two layered portion located below constituting a support member 68. The terminal pin 65 can also move relative to a position fixing hole (not shown) in a direction that is at a right angle with respect to the widthwise direction of the terminal pin 65.

Figure 15:
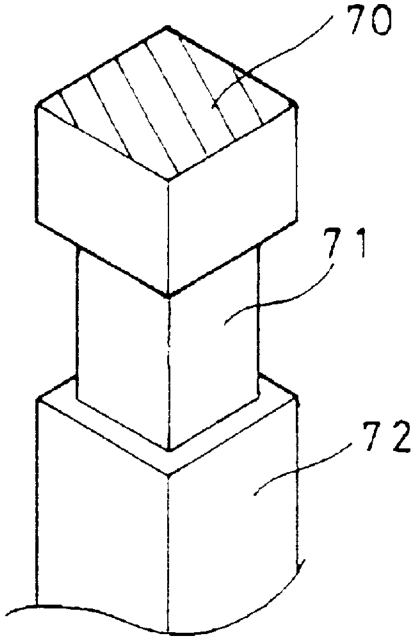
FIG. 15 is a partially enlarged diagonal view of a terminal pin of embodiment 8.

Embodiment 8 of the present invention is described next, with reference to FIG. 15.

A terminal pin 70 approximately forms a square when seen cross-sectionally. At a specified location on the terminal pin 70, a movement permitting recess 71 is formed by cutting the anterior, posterior, left and right faces so as to reduce the diameter of the terminal pin 70. Further, a support member 72 is defined below the recess 71. According to the present embodiment, the terminal pin 70 can move relative to a position fixing hole (not shown in FIG. 15) in the anterior, posterior, left and right directions.

Figure 16:
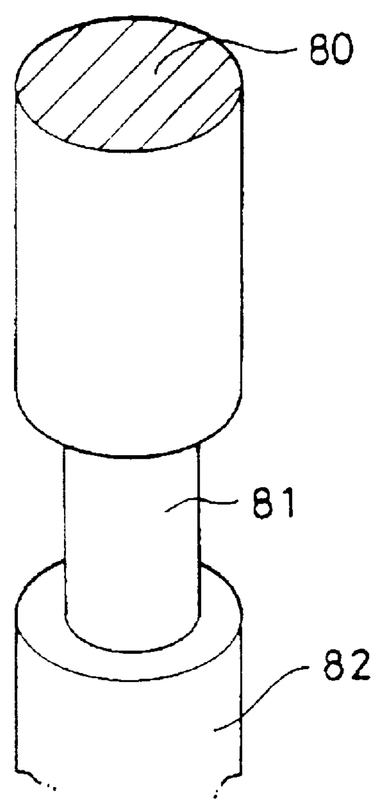
FIG. 16 is a partially enlarged diagonal view of a terminal pin of embodiment 9.
Figure 17:
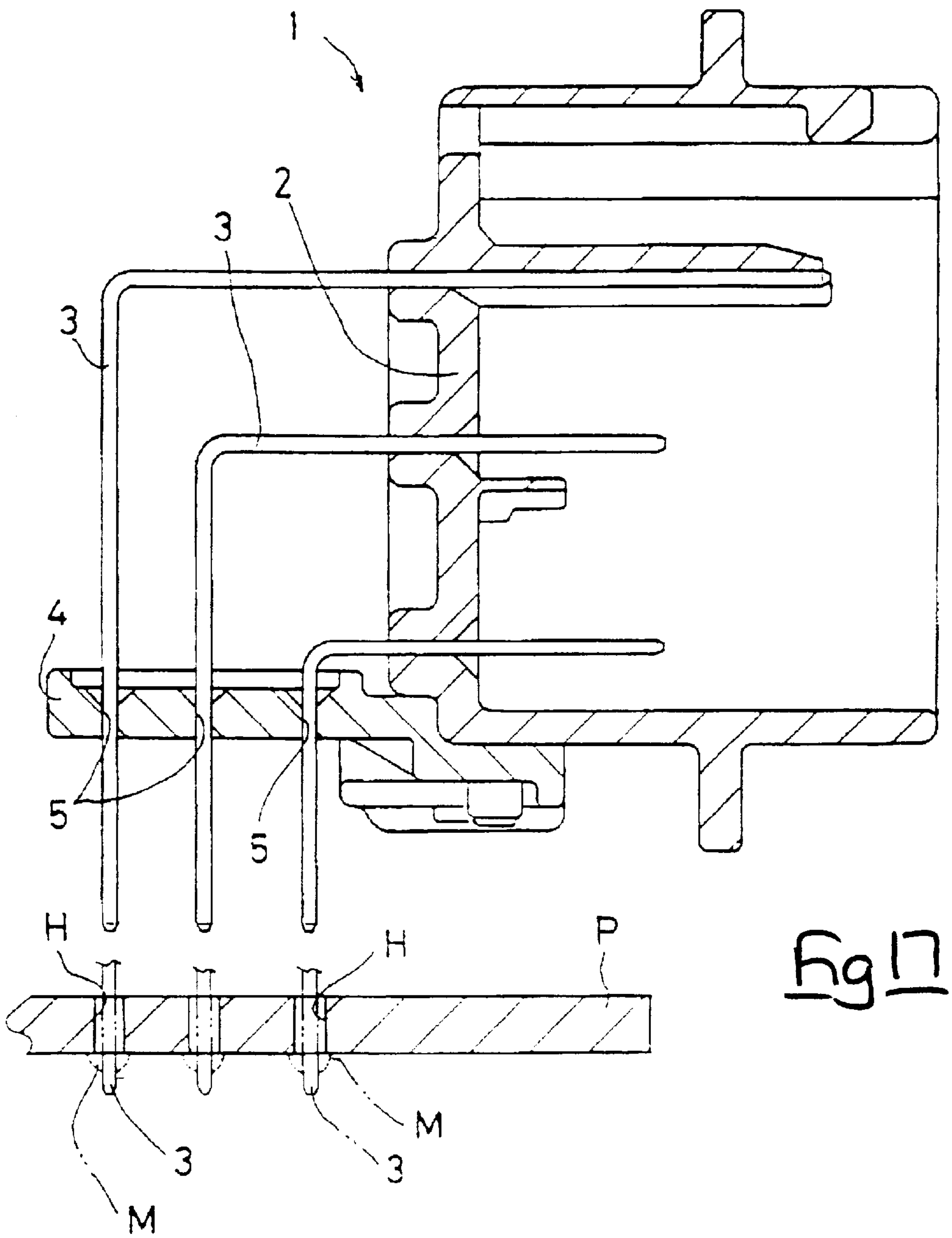
FIG. 17 is a cross-sectional view of a prior art alignment plate.
Figure 18:
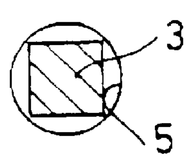
FIG. 18 is a cross-sectional view showing terminal pins in an inserted state in position fixing holes of the prior art alignment plate.

Embodiment 9 of the present invention is described next, with reference to FIG. 16.

A terminal pin 80 of the present embodiment has a circular shape along its entire length when seen in cross-section. At a specified location on the terminal pin 80, a recess 81 is formed by creating a smaller diameter concentrically. The lower side of this recess 81 constitutes a support 82. The terminal pin 80 is capable of moving not only in the anterior, posterior, left and right directions with respect to a position fixing hole with a circular opening (not shown in FIG. 16), but in any other direction as well. Moreover, the recess 81 is concentrically formed with respect to the support member 82 and the space between the recess and the edges of position fixing holes is the same along the entire circumference.

In this way, embodiment 9 has no restrictions on the direction of movement of the terminal pin 80 with respect to the position fixing hole. Moreover, since the relative movement stroke is the same in all directions, this embodiment is the most desirable among the embodiments described in the present application.

The present invention is not limited to the embodiments described above with the aid of figures. For example, the possibilities described below also lie within the technical range of the present invention. Moreover, the present invention may be embodied in various ways other than those described below without deviating from the scope thereof.

(1) Although in the above embodiments the alignment plate is arranged to move in the direction of increasing proximity to the circuit base plate when the alignment plate moves from the support position to the release position, it may equally be arranged so that it moves in the direction of increasing distance from the circuit base plate.

(2) The attachment of the connector housing to the circuit base plate and the movement of the alignment plate from the alignment position to the release position can equally be carried out using different operations.

(3) In the attached state to the circuit base plate, the alignment plate is supported in the release position in the above embodiments by means of the fitting of the alignment plate and the connector housing. However, it may equally be arranged so that this is carried out by fitting the alignment plate to the circuit base plate.

We claim:

1. An electrical connector for attachment to a printed circuit board comprising a connector housing having a plurality of elongate electrical terminals projecting therefrom, each said terminal including a support at one end adapted to be attached to a printed circuit board, said supports extending in a first direction, and an alignment member attached to said housing, said alignment member being movable with respect to the housing in said first direction along said supports from an alignment position to an attachment position, said alignment member including a plurality of apertures extending therethrough in said first direction, each aperture receiving one of the terminals such that the terminals are tightly retained by said alignment member in the alignment position to retain said supports of said terminals in a substantially fixed orientation with respect to the housing and align the terminals with holes in the printed circuit board, and loosely retained by said alignment member in the attachment position to permit movement of said alignment member relative to the printed circuit board without placing undue stress on the terminals, wherein the support of each of said terminals has a substantially constant cross-section, each support being in tight slidable relationship in a respective one of said apertures when said alignment member is in the alignment position, and wherein each of said terminals has a reduced cross-section portion behind the support with a recess on both sides, each reduced cross-section portion being loosely retained in the respective aperture when the alignment member is in said attachment position, and wherein said attachment position of said alignment member is closer to said housing than the alignment position.

2. An electrical connector according to claim 1 wherein each said terminal is formed from sheet metal with lateral edge portions which are folded inward to generally define a closed 'C' shape, and wherein the reduced cross-section portion of each terminal is formed by cutting away the lateral edge portions thereof.

3. An electrical connector according to claim 1 wherein each said terminal has a circular cross-section and a longitudinal axis, and wherein each reduced cross-section portion has a circular crop-section which is concentric with the longitudinal axis of the terminal.

4. An electrical connector according to claim 1 wherein each said terminal has a rectangular cross-section, and wherein each reduced cross-section portion is formed by removing an equal depth of material from each side of the terminal.

5. An electrical connector according to claim 1 wherein said alignment member and said housing have a mutual latching detent to maintain said member in a fixed orientation with respect to said housing in said attachment position.

6. An electrical connector according to claim 5 wherein said detent comprises a snap-fitting connection adapted to permit said alignment member to move abruptly from the alignment position to the attachment position.

7. An electrical connector according to claim 6 wherein said alignment member has substantially parallel opposite edges, said housing has foot members with inner mutual side faces which define opposite parallel grooves to receive said edges, and said grooves define the alignment and attachment positions of said alignment member.

8. An electrical connector according to claim 7 wherein said opposite edges and said grooves are triangular in cross-section.

9. An electrical connector according to claim 7 wherein said alignment member further includes stoppers at the ends of said opposite edges to engage said foot members and prevent movement of said alignment member in the direction of said grooves.

10. An electrical connector according to claim 1 wherein said alignment member is substantially planar.

11. An electrical connector according to claim 10 wherein the plane of said alignment member is substantially perpendicular to said first direction.

* * * * *